(12) United States Patent
Friedrich et al.

(10) Patent No.: US 11,163,021 B2
(45) Date of Patent: Nov. 2, 2021

(54) SENSORS HAVING SIGNAL REDUNDANCY

(71) Applicant: Allegro MicroSystems, LLC, Manchester, NH (US)

(72) Inventors: Andreas P. Friedrich, Metz-Tessy (FR); Christophe Lutz, Vitry-sur-Seine (FR)

(73) Assignee: Allegro MicroSystems, LLC, Manchester, NH (US)

( * ) Notice: Subject to any disclaimer, the term of this patent is extended or adjusted under 35 U.S.C. 154(b) by 65 days.

(21) Appl. No.: 16/809,823

(22) Filed: Mar. 5, 2020

(65) Prior Publication Data
US 2021/0278485 A1 Sep. 9, 2021

(51) Int. Cl.
*G01R 33/07* (2006.01)
*G01D 5/14* (2006.01)
*G01C 21/36* (2006.01)
*G01R 33/00* (2006.01)

(52) U.S. Cl.
CPC .......... *G01R 33/072* (2013.01); *G01C 21/36* (2013.01); *G01D 5/14* (2013.01); *G01R 33/0005* (2013.01); *G01R 33/0029* (2013.01)

(58) Field of Classification Search
CPC .............. G01R 33/072; G01R 33/0029; G01R 33/0005; G01D 5/14; G01C 21/36
USPC ................... 324/207.2, 207.13, 207.11, 200
See application file for complete search history.

(56) References Cited

U.S. PATENT DOCUMENTS

| | | |
|---|---|---|
| 5,781,005 A | 7/1998 | Vig et al. |
| 5,917,320 A | 6/1999 | Scheller et al. |
| 6,091,239 A | 7/2000 | Vig et al. |
| 6,278,269 B1 | 8/2001 | Vig et al. |
| 6,525,531 B2 | 2/2003 | Forrest et al. |
| 6,693,419 B2 | 2/2004 | Stauth et al. |
| 7,026,808 B2 | 4/2006 | Vig et al. |
| 7,253,614 B2 | 7/2007 | Forrest et al. |
| 7,368,904 B2 | 5/2008 | Scheller et al. |
| 7,772,838 B2 | 8/2010 | Bailey et al. |
| 7,777,607 B2 | 8/2010 | Taylor et al. |
| 8,450,996 B2 | 5/2013 | Foletto et al. |
| 8,577,634 B2 | 11/2013 | Donovan et al. |
| 8,624,588 B2 | 1/2014 | Vig et al. |
| 8,729,892 B2 | 5/2014 | Friedrich |
| 9,007,054 B2 | 4/2015 | Friedrich et al. |
| 9,941,224 B2 | 4/2018 | Lamar et al. |
| 10,147,689 B2 | 12/2018 | Lamar et al. |
| 10,380,879 B2 | 8/2019 | Haas et al. |
| 10,481,220 B2 | 11/2019 | Alpago et al. |
| 10,580,289 B2 | 3/2020 | Haas et al. |
| 10,692,362 B2 | 6/2020 | Petrie et al. |
| 2012/0249126 A1 | 10/2012 | Friedrich et al. |

(Continued)

*Primary Examiner* — Giovanni Astacio-Oquendo
(74) *Attorney, Agent, or Firm* — Daly Crowley Mofford & Durkee, LLP

(57) ABSTRACT

Methods and apparatus for combining redundant signals to generate outputs signals with enhanced accuracy and/or risk level. In embodiments, first signals are generated by a first transducer and second signals are generated by a second transducer. In other embodiments, first signals are generated by a first die and second signals are generated by a second die. An amount of overlap between error distributions of the first and second signals can be used to detect failure and/or indicate risk of failure.

45 Claims, 8 Drawing Sheets

(56) References Cited

U.S. PATENT DOCUMENTS

| | | | | |
|---|---|---|---|---|
| 2012/0280682 A1* | 11/2012 | Cheng | ................... | G01R 33/44 |
| | | | | 324/301 |
| 2016/0103166 A1* | 4/2016 | Szafraniec | ............. | G01R 27/28 |
| | | | | 324/638 |
| 2017/0234913 A1* | 8/2017 | Yao | ....................... | G01R 19/32 |
| | | | | 324/96 |
| 2019/0319634 A1* | 10/2019 | Zou | ...................... | H03M 1/168 |
| 2020/0213800 A1* | 7/2020 | Jot | ......................... | H04S 7/302 |
| 2020/0236318 A1* | 7/2020 | Okura | ................ | H03F 3/45475 |

* cited by examiner

SENSORS HAVING SIGNAL REDUNDANCY

BACKGROUND

The trend towards advanced driver-assistance systems (ADA) and autonomous vehicles is leading to more stringent requirements on sensor ICs and systems. Four automotive safety integrity levels (ASIL A, B, C and D) are defined by the ISO 26262 functional safety for road vehicles standard. ASIL D dictates the highest integrity requirements. At the sensor level, an ASIL D rating can be achieved through homogeneous redundancy (i.e., two sensor ICs using the same technology, such as Hall elements or magnetoresistive elements, in a single package) or heterogeneous redundancy, e.g., two sensor ICs using different sensing technologies, or one sensor IC including two sensing technologies, for example Hall elements or magnetoresistive elements. Some safety critical applications may require the use of more than two sensor ICs to enable voting.

SUMMARY

Embodiments of the invention provide methods and apparatus for combining redundant signals from the channels of multiple devices for improved safety level and accuracy. While example embodiments are shown and described in conjunction with dual channel angle sensors including SIN/COS angle sensors, it is understood that embodiments of the invention are applicable to sensors in general in which improved safety level and accuracy are desirable.

In one aspect, a method comprises: receiving first signals from a first signal source; receiving second signals from a second signal source, wherein the first and second signals are redundant; and combining the first signals and the second signals to generate a first output signal from the first signals, a second output signal from the second signals, and a third output signal from the first signals and the second signals.

A method can further include one or more of the following features: generating a fourth output signal from first and second signals providing risk information, the first signal source comprises a first transducer and the second signal source comprises a second transducer, the first and second transducers are substantially similar, the first signal source comprises a first die and the second signal source comprises a second die, the third output signal comprises an average (or weighted average, or any combination) of the first and second signals, the third output signal is more accurate than the first or second output signals, the first and second signals each comprise sine and cosine values, the first, second, and third output signals each comprise an angle output signal, generating a fourth output signal from first and second signals providing risk information based on a comparison of similarity of the first signals and the second signals, the comparison of similarity includes using a threshold based on degrees for angle signals generated from sine and cosine signals, assigning a first error distribution to the first signals and a second error distribution to the second signals, assigning rectangular functions to the first and second error distributions, assigning a given number of standard deviations to defines the rectangular functions, determining an amount of overlap between the first and second error distributions, determining a failure condition based on the amount of overlap, determining a level of confidence in the first and/or second signals from the amount of overlap, and/or determining a best estimate for the first and/or second signals from the amount of overlap.

In another aspect, a system comprises: a first signal source configured to generate first signals; a second signal source to generate second signals, wherein the first and second signals are redundant; and a signal processing module configure to combine the first signals and the second signals to generate a first output signal from the first signals, a second output signal from the second signals, and a third output signal from the first signals and the second signals.

A system can further include one or more of the following features: the signal processing module is further configured to generate a fourth output signal from first and second signals providing risk information, the first signal source comprises a first transducer and the second signal source comprises a second transducer, the first and second transducers are substantially similar, the first signal source comprises a first die and the second signal source comprises a second die, the third output signal comprises an average of the first and second signals, the third output signal is more accurate than the first or second output signals, the first and second signals each comprise sine and cosine values, the first, second, and third output signals each comprise an angle output signal, generating a fourth output signal from first and second signals providing risk information based on a comparison of similarity of the first signals and the second signals, the comparison of similarity includes using a threshold based on degrees for angle signals generated from sine and cosine signals, assigning a first error distribution to the first signals and a second error distribution to the second signals, assigning rectangular functions to the first and second error distributions, assigning a given number of standard deviations to defines the rectangular functions, determining an amount of overlap between the first and second error distributions, determining a failure condition based on the amount of overlap, determining a level of confidence in the first and/or second signals from the amount of overlap, and/or determining a best estimate for the first and/or second signals from the amount of overlap.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
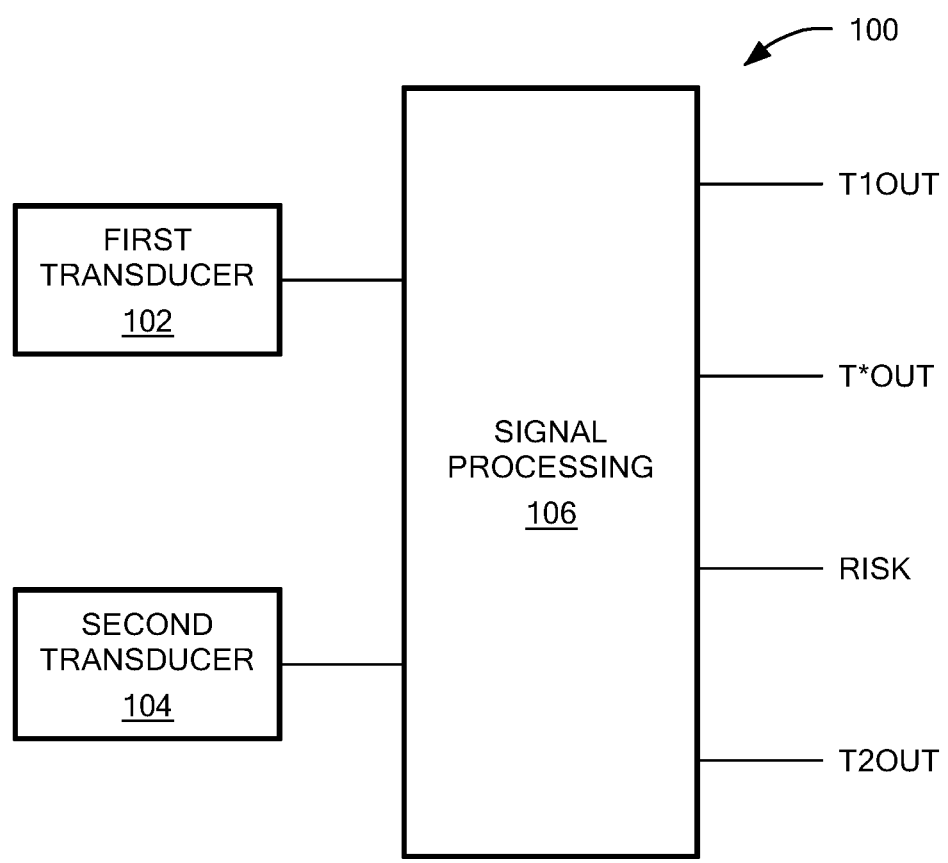
FIG. 1 is a high level block diagram of an example sensor system having multiple transducers generating an approximation of sensed data, redundant and risk assessment signals.

FIG. 1 shows an example system 100 having a first transducer 102 and a second transducer 104 coupled to a signal processing module 106. The signal processing module 106 can receive signals from the first and second transducers 102, 104 and generate various output signals (deterministic or probabilistic, e.g. likelihood of observed samples which also be called evidence) with or without combining the signals from the first and second transducers. As described more fully below, the first and second transducers 102, 104 can be the same type of transducer or different types of transducers.

In the illustrated embodiment, the signal processing module 106 generates a T1OUT signal that corresponds to data from the first transducer 102 and a T2OUT signal that corresponds to data from the second transducer 104. A T*OUT signal, which may be a 'better' estimate of the sensed quantity than T1OUT and T2OUT, is generated from a combination of data from the first and second transducers 102, 104. In embodiments, the signal processing module 106 generates a risk signal that includes an indication of risk of error based on data from the signals of the first and/or second transducer 102, 104.

Figure 2:
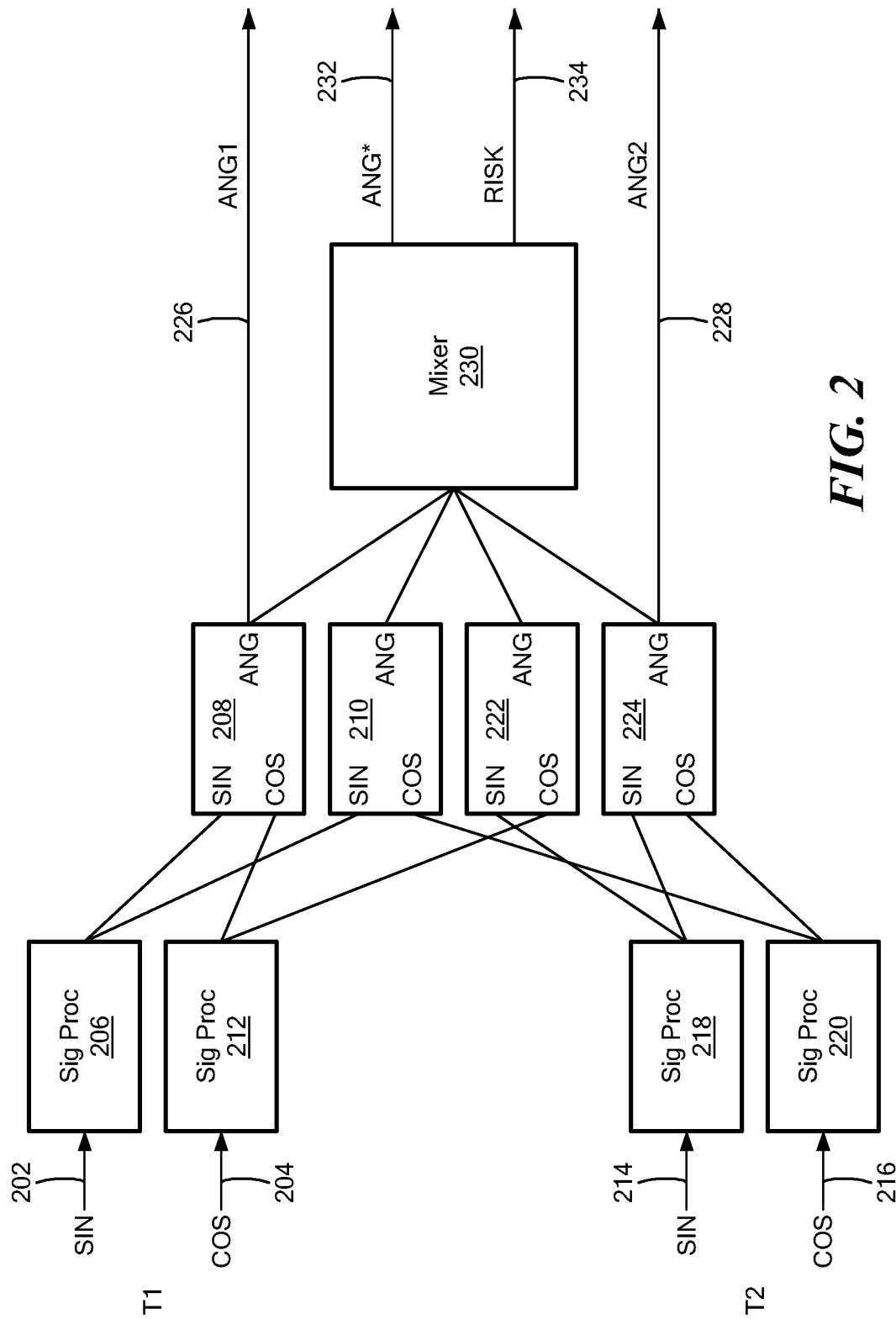
FIG. 2 is a schematic representation of an example sensor system having multiple transducers generating an approximation of sensed data, redundant and risk assessment signals.

FIG. 2 shows an example system 200 having a first transducer T1 that generates first and second output signals 202, 204. In embodiments, the first output signal 202 corresponds to a sine signal for an angle sensor and the second output signal 204 corresponds to a cosine signal for an angle sensor. A first processing block 206 receives the sine signal 202 and performs signal conditioning and/or normalization. For example, the signal is conditioned to remove noise and normalized to be within a given range. The first processing block 206 provides an output signal to a first combiner block 208 and a second combiner block 210.

A second processing block 212 receives the cosine signal 204 and performs signal conditioning and/or normalization. The second processing block 212 provides an output signal to the first combiner block 208 and a third combiner block 222.

In example processing blocks, an arctangent function can be used to generate an angle from sine and sine signals. In some embodiments, circular vertical Hall elements (CVH) are used to generate sine and cosine signals. In other embodiments, first and second sensors are positioned in a quadrature relationship to generate sine and cosine signals. U.S. Pat. No. 7,714,570, which is incorporated herein by reference, describes generating sine and cosine signals and generating an angle output signal from sine and cosine signals. CORDIC processing and signal look up tables can also be used to generate output angle information. One or more features of CVH angle processing may be described in U.S. Pat. Nos. 10,481,220 and 9,007,054, which are incorporated herein by reference.

In the illustrated embodiment, the second transducer T2 generates third and fourth output signals 214, 216. In embodiments, the third output signal 214 corresponds to a sine signal for an angle sensor and the fourth output signal 216 corresponds to a cosine signal from an angle sensor.

A third processing block 218 receives the sine signal 214 and performs signal conditioning and/or normalization and a fourth processing block 220 receives the cosine signal 216 and performs signal conditioning and/or normalization. In the illustrated embodiment, the third processing block 218 provides an output signal to the third combiner block 222 and a fourth combiner block 224. The fourth processing block 220 provides an output signal to the second combiner block 210 and the fourth combiner block 224.

In the illustrated embodiment, the first combiner block 208 generates an output signal 226, which may correspond to an angle output signal based on the sine and cosine signals 202, 204 from the first transducer. The fourth processing block 224 generates an output signal 228, which may correspond to an angle output signal based on the sine and cosine signals 214, 216 from the second transducer. The output signals 226, 228 can also be provided to a mixing block 230. The mixing block 230 may receive output signals from the second and third combiner blocks 210, 222. In the illustrated embodiment, the mixing block 230 receives angle signals generated from each possible sine and cosine combination from the first and second transducers.

In embodiments, the mixing block 230 outputs a combined angle signal 232 generated from a combination of one or more of the angle signals from the combiner blocks 208, 210, 222, 224. In some embodiments, the outputs of the first and fourth combiner blocks 208, 224, are combined, such as averaged, to generate an angle output signal 232 that may be more accurate than the output signals 226, 228, where output signal 226 is generated from the first transducer T1 alone and output signal 228 is generated from the second transducer T2 alone.

The angle outputs from the combiner blocks 208, 210, 222, 224 can be combined by the mixing block in a variety of ways to meet the needs of a particular application. In some embodiments, each of angle outputs are averaged. In other embodiments, some angle outputs are weighted more heavily than others. For example, the angle outputs from the first and fourth combiner blocks 208, 224 may be weighted more heavily than the angle outputs from the second and third combiner blocks 210, 222. In some embodiments, angle outputs are combined/processed using Kalman filtering which is the statistical best estimate given knowledge of current signals values and associated error distributions (e.g., maximum likelihood estimate.

In the illustrated embodiment, the following angles are generated:

Angle calculated from SIN signal of transducer T1 and COS signal of transducer T1

Angle calculated from SIN signal of transducer T1 and COS signal of transducer T2

Angle calculated from SIN signal of transducer T2 and COS signal of transducer T1

Angle calculated from SIN signal of transducer T2 and COS signal of transducer T2

In the illustrated embodiment, the mixing block 230 outputs a risk signal 234 corresponding to a confidence level in one or more of the angle output signals 226, 232, 228. In embodiments, differences greater than a given threshold between two or more of the angle outputs from the combiner blocks 208, 210, 222, 224 may cause the risk signal 234 to transition to an active state.

In an example embodiment, a difference greater than two degrees between the angle outputs of the output signal 226 generated from the first transducer and the output signal 228 generated from the second transducer 228 causes the risk signal 234 to transition to an active state. In another example, a difference greater than five degrees between the angle outputs of the angle outputs generated from the second combine block 210 and the angle output signal generated by the third combiner block 222 causes the risk signal 234 to transition to an active state. The difference threshold between compared signals can vary based on the application, sensor type, user requirement, and the like. The specific constraints may constitute part of the hardware safety requirements for safety critical applications.

In some embodiments, the risk signal 234 is a digital signal having a first state that is inactive when risk is less than a selected threshold and a second state that is active when risk is above the selected threshold. In other embodiments, the risk signal 234 provides an analog risk information as a confidence level, a percentage, values within some range, or the like.

In example embodiments, risk is considered low or inactive when each of the angle output signals 226 (ANG1), 228 (ANG2), 232 (ANG*) are substantially the same or within some threshold. As one or more of these signals diverge from the other signals, the risk of failure can be considered to be active or increased. in another example, Kalman filters estimate not only the most likely correct value ANG* but also its likelihood (distribution spread, e.g. standard deviation) which serve as risk assessment 234.

In one example implementation, a magnetic sensor can sense the angular position of an engine camshaft that rotates about an axis. Two or more transducers, die, and/or ICs can be used to sense the position of the camshaft. The accuracy obtainable from any of the transducers, die, and/or ICs can vary due to axial misalignment of the shaft, inherent measurement limitations, temperature changes, process variations and the like.

Figure 2A:
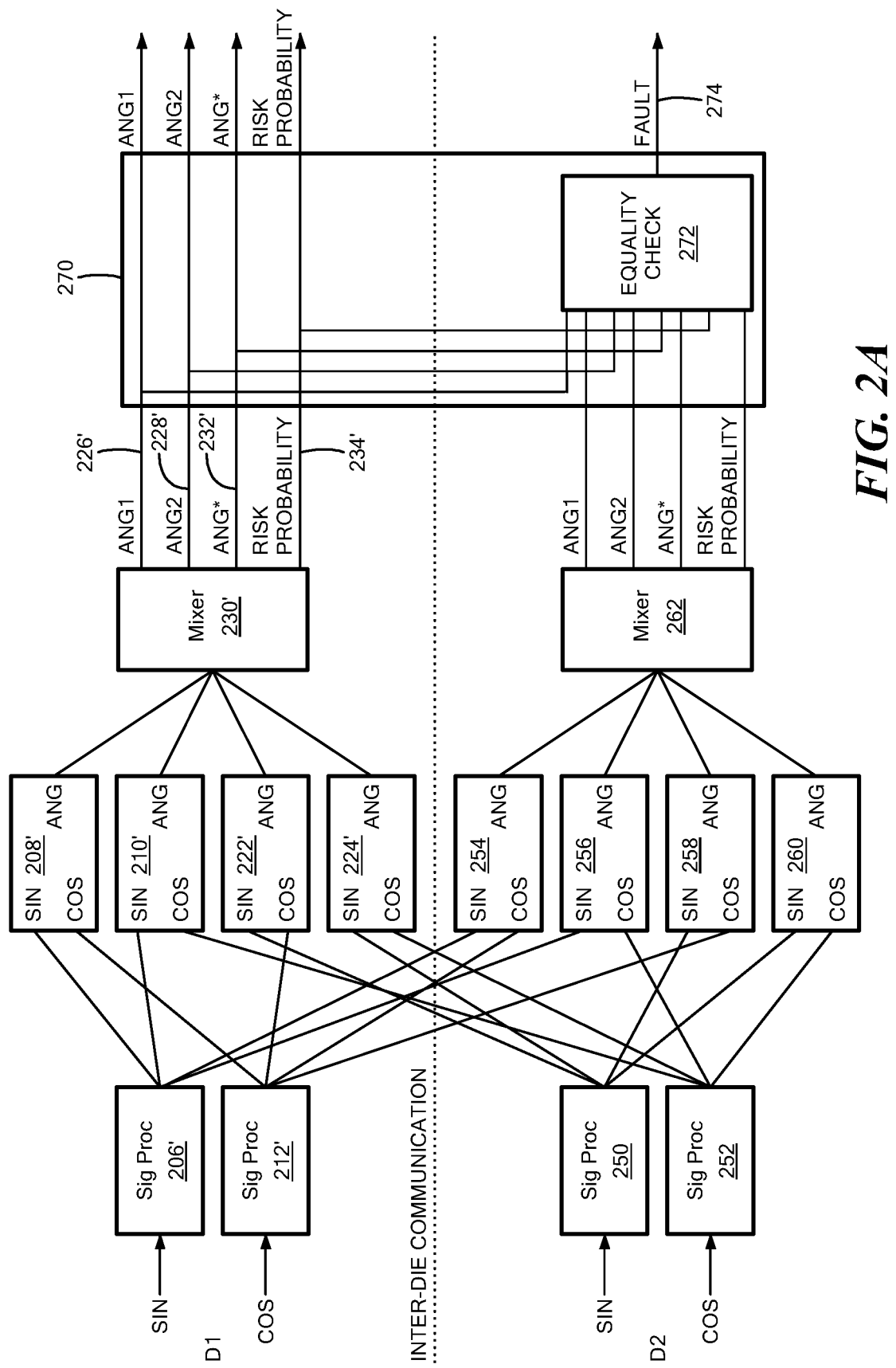
FIG. 2A is a schematic representation of an example sensor system having multiple die generating redundant and risk assessment signals.

FIG. 2A shows a system having some commonality with the system of FIG. 2 for first and second die D1, D2 instead of transducers. A first processing block 206' receives a sine signal from circuitry/sensing elements on a first die D1 and a second processing block 212' receives a cosine signal. The processed signals are provided to first, second, third and fourth combiner blocks 208', 210', 222', 224', which provides angle output signals to a first mixer block 230' on the first die. Similarly, processing blocks 250, 252 on the second die provide signals to combiner blocks 254, 256, 258, 260, which provide angle output signals to a second mixer block 262 on the second die. Sine and cosine signals from the processor blocks 206', 212' also provide output signals to the combiner blocks 254, 256, 258, 260 on the second die and the processor blocks 250, 252 on the second die provide output signals to the combiner blocks 208', 210', 222', 224' on the first die D1.

The first and second mixer blocks 230', 262 provide similar angle and risk signals ANG1, ANG2, ANG*, RISK to a remote system 270, such as an engine control unit (ECU). The ECU 270 can include an equality module 272 to compare the signals from the first and second mixer blocks 230', 262. If the angle output signals from the first and second die are not within some threshold, a fault signal 274 can become active. In some embodiments, the fault signal 274 may become active if either of the risk signals from mixers 230', 262 are above a given threshold. The equality check 272 can be alternatively be integrated in one or repeated in each sensing system for additional redundancy.

Figure 3A:
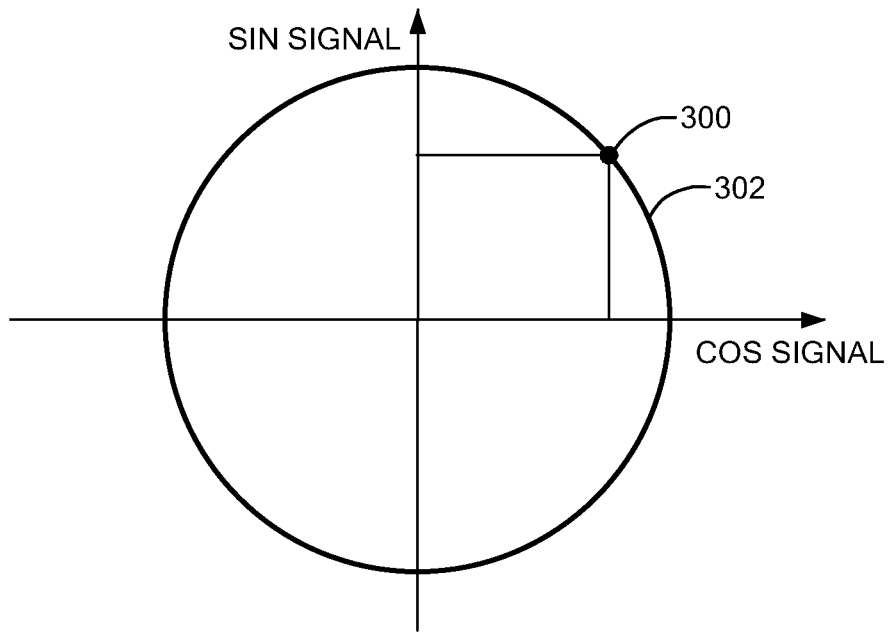
FIG. 3A is a graphical representation of a data point from a non-redundant sensor on a trigonometric circle.
Figure 3B:
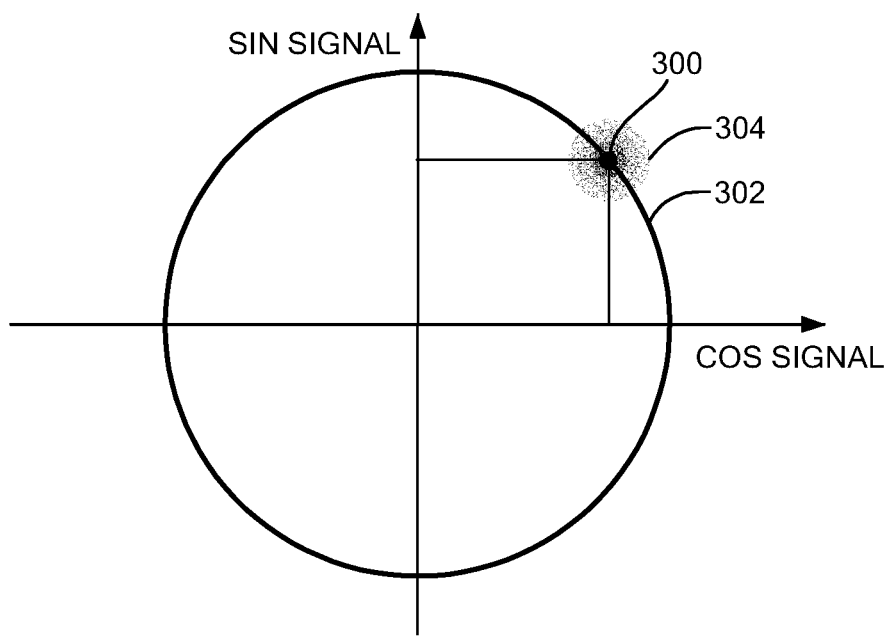
FIG. 3B is a graphical representation of the data point of FIG. 3A with an error distribution.

FIG. 3A shows an example representation of a sine, cosine relationship 300 shown as a point normalized to lie on a trigonometric circle 302. FIG. 3B shows the effects 304 of electronic noise (thermal noise, flicker noise, dynamic error due to vibrations, etc.) so that the point 300 is subject to random disturbances that makes the point fluctuate around its average position. In embodiments, the point 300 can be modeled to follow a two-dimensional (2D) gaussian probability density distribution represented by 304.

Figure 4A:
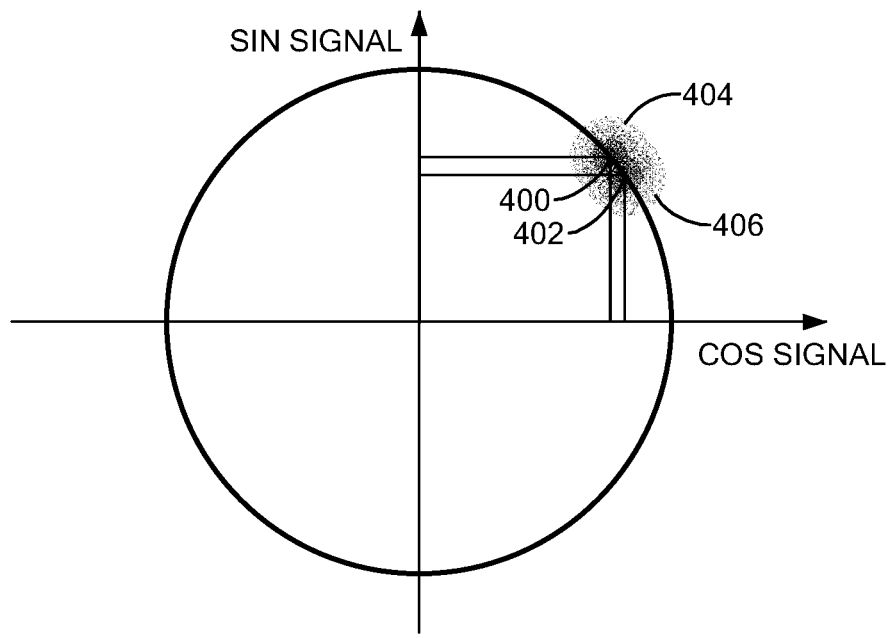
FIG. 4A is a graphical representation of redundant first and second data points and respective error distributions.

FIG. 4A shows redundant first and second points 400, 402 defined by sine, cosine pairs, each of which is subject to the effects 404, 406 of noise and randomness. In an ideal system, the first and second transducers/die/etc., provide first and second channels that generate the same signal. That is, in an ideal system, the redundant first and second points 400, 402 are the same point, i.e., they are coincident. In one implementation example, the first and second points 400, 402 can correspond to a sensed magnetic field. In practice, due to sensing element and electronic mismatch, the positions of the redundant first and second points 400, 402 are slightly different and may have different accuracies, resolutions or noises.

In embodiments, the first and second points 400, 402 are redundant. Redundancy refers to the repetition of two or more signals of same or different nature which entails similar information. One role of redundancy is to detect one or more failures or anomalies by comparison, or by detection of abnormal combinations of signals.

Redundancy can be global or local to the system. An example of global system redundancy is dual die or stacked die which means that two dies are placed within the same package. Another example of global system redundancy is the duplication of the hardware, e.g., two or more integrated circuits are placed on the PCB. An example of local redundancy is represented by the duplication of a functional block within a system, e.g., two independent temperature sensing systems.

Signal comparison may be performed synchronously (to the best extent depending on system resources) for a comparison of data of same temporality. More advanced schemes can be used for value prediction based on currently available data for a comparison to a future data, e.g. of Kalman filter which uses measurements and predictions from a model with past data. The latter requires additional temporary data storage.

Figure 4B:
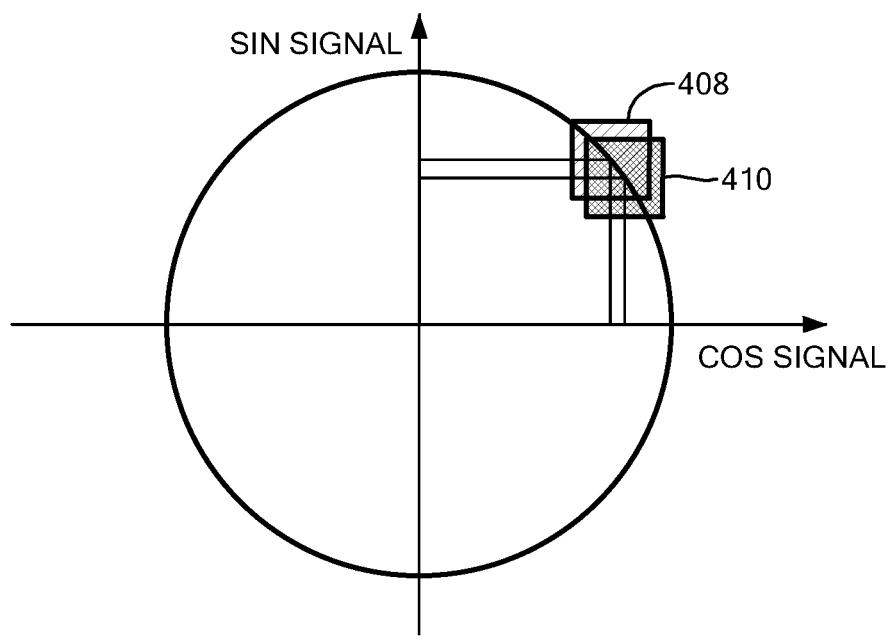
FIG. 4B is a graphical representation of the first and second data points of FIG. 4A with example rectangular-approximated error distributions.

As shown in FIG. 4B, in embodiments, the first and second points 400, 402, which are redundant, have respective error distributions 408, 410 corresponding to the effects 404, 406 shown in FIG. 4A. In example embodiments, the error distributions 408, 410 are approximated by a 2D rectangle function centered on the respective sample 400, 402 for generating a maximum likelihood estimate. In one embodiment, a Gaussian distribution is used. It is understood that any suitable distribution can be used to meet the needs of a particular application.

In embodiments, the error distribution 408, 410 rectangle widths/lengths are set by noise measures. In one particular embodiment, the values are determined using six standard deviations. It is understood that the distribution 408, 410 widths and lengths can be different but are equal in the illustrated embodiment so as to form squares. The corners of the first and second rectangles, here squares, for the distributions 408, 410 are defined by the current samples (respectively x,y and x,y) value and the distribution standard deviation σ:

TABLE 1

| Corners | Error Distribution 408 | Error Distribution 410 |
|---|---|---|
| Upper Left | $(x - 3\sigma, y + 3\sigma)$ | $(x - 3\sigma, y + 3\sigma)$ |
| Upper Right | $(x + 3\sigma, y + 3\sigma)$ | $(x + 3\sigma, y + 3\sigma)$ |
| Lower Left | $(x - 3\sigma, y - 3\sigma)$ | $(x - 3\sigma, y - 3\sigma)$ |
| Lower Right | $(x + 3\sigma; y - 3\sigma)$ | $(x + 3\sigma; y - 3\sigma)$ |

It is understood that plus and minus 3σ corresponds to six standard deviations to define the distribution. It if further understood that the number of standard variations, as well as the variance in general, can be selected to meet the needs of a particular application.

Figure 5:
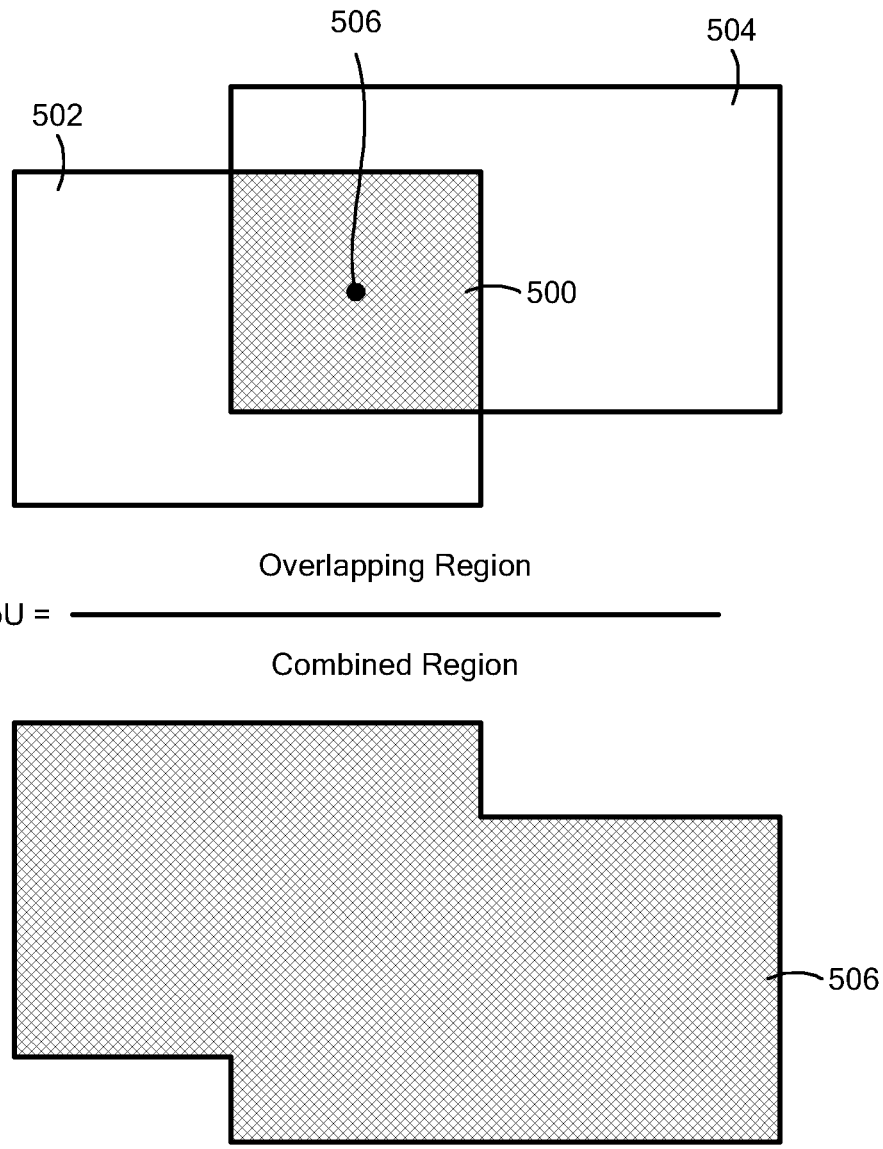
FIG. 5 is a representation of intersection over union with overlapping and combined regions for risk assessment with redundant data points.

FIG. 5 shows an example representation of intersection over union (IoU) for respective error distributions for redundant first and second points. The IoU corresponds to the probability of an event. The overlapping region 500 of first and second distributions 502, 504 can form a numerator and a combined region 506 of the first and second distributions can form a denominator. The first and second regions 500, 502 can correspond to the first and second distributions 408, 410 of FIG. 4B.

The IoU satisfies the properties of a probability function

Its value is in [0,1]

Its value is maximum when the points agree (complete overlap)

Its value is zero when the points disagree (no overlap)

In embodiments, the IoU value for first and second error distributions can be used to detect a failure of one or more channels. A center 506 of the overlapping region 500 may be a preferred estimate of the sample, such as the samples 400, 402 of FIG. 4A. The IoU value may represent the level of confidence (probability) in the measure, as well as a best point estimate for use by the system.

Figure 6:
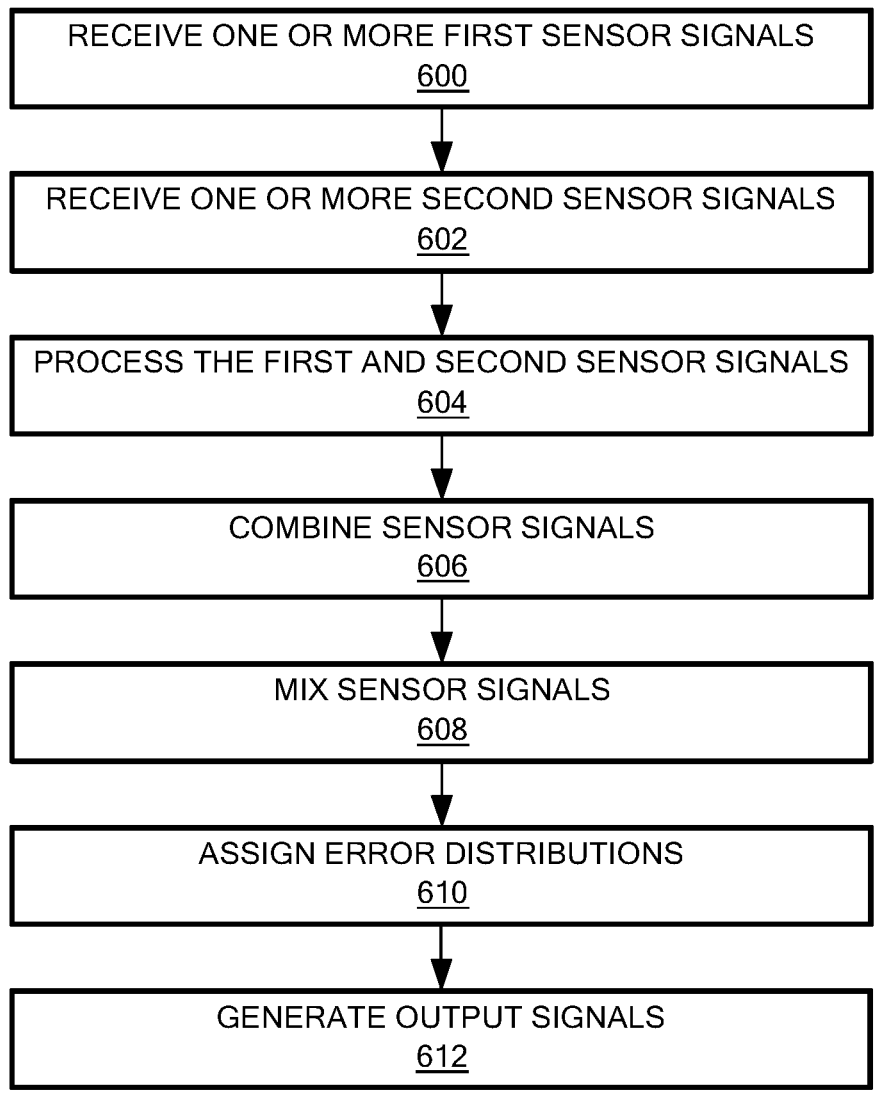
FIG. 6 is a flow diagram for generating and processing redundant data points.

FIG. 6 shows an example sequence of steps for processing redundant sensor signals. In step 600, first sensor signals are received and in step 602, second sensor signals are received. In one embodiment, the first sensor signals are generated by a first transducer and the second sensor signals are generated by a second transducer. In other embodiments, the first sensor signals are generated on or about a first die and the second sensor signals are generated on or about a second die.

In step 604, the first and second sensor signals are processed, such as filtered to remove noise. In step 606, the first and second sensor signals are combined to generate one or more output signals. In step 608, some of the output signals can be mixed. In step 610, redundant data points of the first and second sensor signals can be assigned error distributions. In step 612, sensor output signals can be generated including mixed and unmixed signals and risk signals.

In example embodiments, sensor output signals can include a first angle signal from a first transducer or die, a second angle signal from a second transducer or die, and a third angle signal of enhanced accuracy generated from signals from two or more transducers or die. In some embodiments, a risk signal can be generated from redundant data points from the first and second transducers or die based on respective error distributions. In embodiments, an amount of overlap of error distributions for redundant points can be used to quantify risk.

In other embodiments, other suitable techniques to compare error distributions of redundant points can be used to meet the needs of a particular application. For example, Bayesian inference or Markov decision processes approach that estimate the probability of successive events and can identify abnormal sequences as proof of a faulty behavior.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel (or in-plane) to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "accuracy," when referring to a magnetic field sensor, is used to refer to a variety of aspects of the magnetic field sensor. Illustrative sensors include current sensors, angle sensors, speed sensors and the like. These aspects include, but are not limited to, an ability of the magnetic field sensor to: be a correct representation of a static, alternating or varying sensed signals, have a minor dependence on the perturbations (background noise or interferences), have minor dependence to its physical environment (temperature, stress), provide a repeatable output over cycling and aging, differentiate a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Examples herein may describe a particular target, such as engine camshaft ferromagnetic target. However, similar circuits and techniques can be used with other cams or gears or ring magnets disposed upon the engine camshaft, or upon other rotating parts of an engine (e.g., crank shaft, transmission gear, anti-lock braking system (ABS), or upon rotating parts of a device that is not an engine. Other applications may include linear translation sensors or other sensors where the target is not a rotating gear. Magnetic sensors can be used with permanent magnets (ferrites, neodymium or any ferromagnetic materials), with current flowing in coils (e.g. motor phases), with or without a magnetic concentrator or any sources of magnetic field (e.g. the earth).

The gear can have ferromagnetic gear teeth, which are generally soft ferromagnetic objects, but which can also be hard ferromagnetic objects, patterns, or domains which may or may not have actual physical changes in their shape. Also, while examples are shown below of magnetic field sensors that can sense ferromagnetic gear teeth or gear teeth edges upon a gear configured to rotate, the magnetic field sensors can be used in other applications. The other applications include, but are not limited to, sensing ferromagnetic objects upon a structure configured to move linearly.

Example magnetic field sensors can have a variety of features that may be described in one or more of the following U.S. Pat. Nos. or Patent Publications: 6,525,531, 6,278,269, 5,781,005, 7,777,607, 8,450,996, 7,772,838, 7,253,614, 7,026,808, 8,624,588, 7,368,904, 6,693,419, 8,729,892, 5,917,320, 6,091,239, 2012/0249126, all of which are herein incorporated herein by reference.

Figure 7:
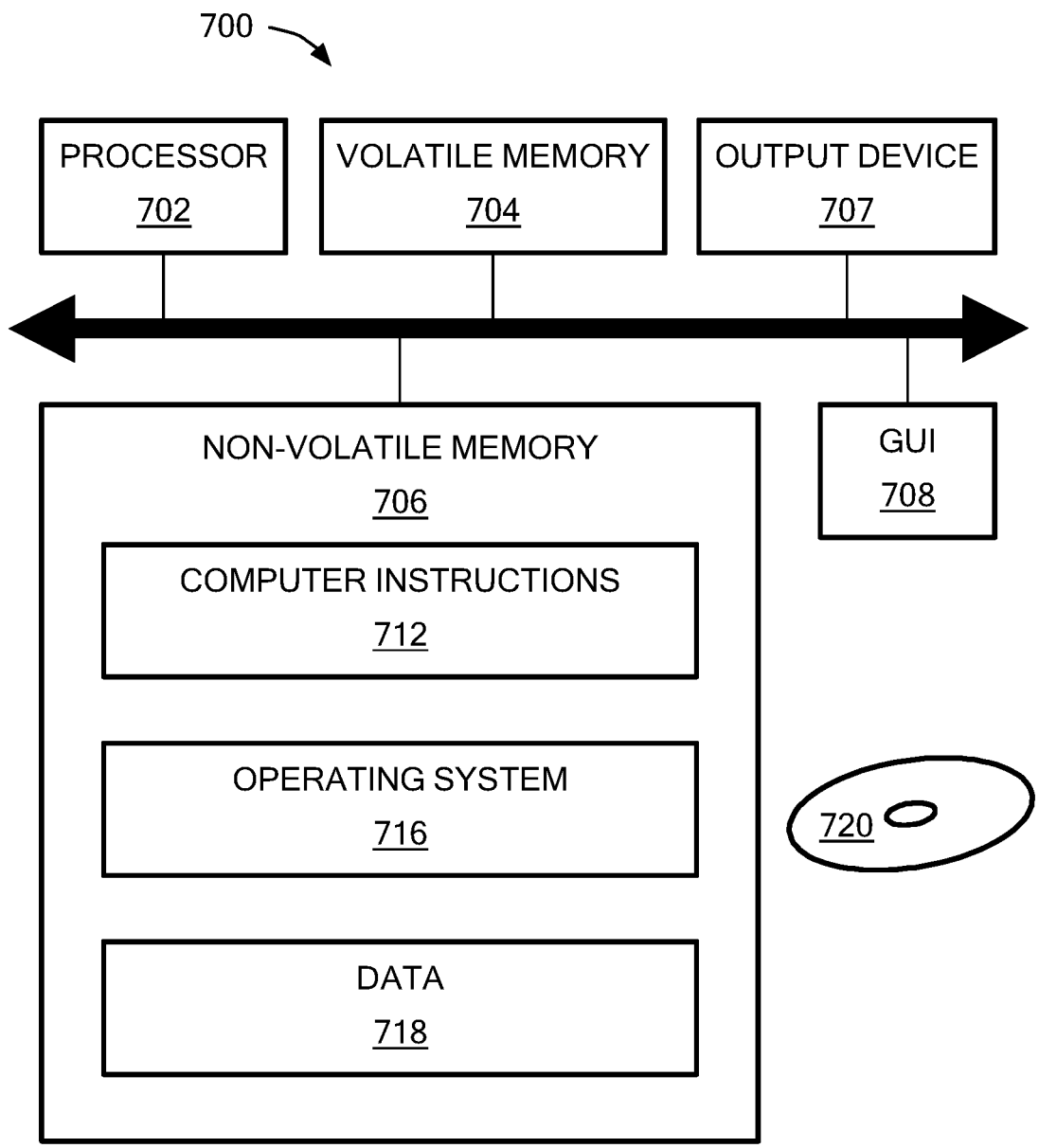
FIG. 7 is a schematic representation of an example computer than can perform at least a portion of the processing described herein.

FIG. 7 shows an exemplary computer 700 that can perform at least part of the processing described herein. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
   receiving first signals from a first signal source;
   receiving second signals from a second signal source, wherein the first and second signals are redundant; and
   combining the first signals and the second signals to generate a first output signal from the first signals, a second output signal from the second signals, and a third output signal from the first signals and the second signals.

2. The method according to claim 1, further including generating a fourth output signal from first and second signals providing uncertainty and/or risk information.

3. The method according to claim 1, wherein the first signal source comprises a first transducer and the second signal source comprises a second transducer.

4. The method according to claim 3, wherein the first and second transducers are substantially similar.

5. The method according to claim 3, wherein the first and second transducers are substantially dissimilar or of different nature.

6. The method according to claim 1, wherein the first signal source comprises a first die and the second signal source comprises a second die.

7. The method according to claim 1, wherein the third output signal comprises a combination, such as average, of the first and second signals.

8. The method according to claim 7, wherein the combination comprises an average.

9. The method according to claim 1, wherein the third output signal is more accurate than the first or second output signals taken independently.

10. The method according to claim 1, wherein the first and second signals each comprise sine and cosine values.

11. The method according to claim 10, wherein the first, second, and third output signals each comprise processed signals from transducers.

12. The method according to claim 1, further including generating a fourth output signal from first and second signals providing risk information based on a comparison of similarity of the first signals and the second signals.

13. The method according to claim 12, wherein the comparison of similarity includes using a threshold based on degrees for angle signals generated from sine and cosine signals.

14. The method according to claim 1, further including assigning a first error distribution to the first signals and a second error distribution to the second signals.

15. The method according to claim 14, further including assigning rectangular functions to the first and second error distributions.

16. The method according to claim 15, further including assigning a given number of standard deviations to defines the rectangular functions.

17. The method according to claim 14, further including assigning Gaussian functions to the first and second error distributions.

18. The method according to claim 14, further including determining an amount of overlap between the first and second error distributions.

19. The method according to claim 18, further including determining a failure condition based on the amount of overlap.

20. The method according to claim 19, further including determining a level of confidence in the first and/or second signals from the amount of overlap or intersection of distributions.

21. The method according to claim 18, further including determining a best estimate for the first and/or second signals from the amount of overlap.

22. A system, comprising:
a first signal source configured to generate first signals;
a second signal source to generate second signals, wherein the first and second signals are redundant; and
a signal processing module configure to combine the first signals and the second signals to generate a first output signal from the first signals, a second output signal from the second signals, and a third output signal from the first signals and the second signals.

23. The system according to claim 22, wherein the signal processing module is further configured to generate a fourth output signal from first and second signals providing risk information.

24. The system according to claim 22, wherein the first signal source comprises a first transducer and the second signal source comprises a second transducer.

25. The system according to claim 24, wherein the first and second transducers are substantially similar.

26. The system according to claim 22, wherein the first signal source comprises a first die and the second signal source comprises a second die.

27. The system according to claim 22, wherein the third output signal comprises a combination, of the first and second signals.

28. The system according to claim 22, wherein the third output signal is more accurate than the first or second output signals.

29. The system according to claim 22, wherein the first and second signals each comprise sine and cosine values.

30. The system according to claim 29, wherein the first, second, and third output signals each comprise an angle output signal.

31. The system according to claim 22, further including generating a fourth output signal from first and second signals providing risk information based on a comparison of similarity of the first signals and the second signals.

32. The system according to claim 31, wherein the comparison of similarity includes using a threshold based on degrees for angle signals generated from sine and cosine signals.

33. The system according to claim 22, further including assigning a first error distribution to the first signals and a second error distribution to the second signals.

34. The system according to claim 33, further including assigning rectangular functions to the first and second error distributions.

35. The system according to claim 34, further including assigning a given number of standard deviations to defines the rectangular functions.

36. The system according to claim 34, further including determining an amount of overlap between the first and second error distributions.

37. The system according to claim 36, further including determining a failure condition based on the amount of overlap.

38. The system according to claim 36, further including determining a level of confidence in the first and/or second signals from the amount of overlap.

39. The system according to claim 36, further including determining a best estimate for the first and/or second signals from the amount of overlap.

40. The system according to claim 33, further including assigning Gaussian functions to the first and/or second error distributions.

41. A system, comprising:
a first signal source means for generating first signals;
a second signal source means for generating second signals, wherein the first and second signals are redundant; and
a signal processing means for combining the first signals and the second signals to generate a first output signal from the first signals, a second output signal from the second signals, and a third output signal from the first signals and the second signals.

42. The system according to claim 41, wherein the signal processing means further generates a fourth output signal from first and second signals providing risk information.

43. The system according to claim 41, wherein the first signal source means comprises a first transducer and the second signal source means comprises a second transducer.

44. The system according to claim 43, wherein the first and second transducers are substantially similar.

45. The system according to claim 41, wherein the first signal source means comprises a first die and the second signal source means comprises a second die.

* * * * *